United States Patent
Kazama et al.

(10) Patent No.: US 11,996,847 B1
(45) Date of Patent: May 28, 2024

(54) POWER TRANSISTOR ADAPTIVE CLAMP CIRCUIT

(71) Applicant: TEXAS INSTRUMENTS INCORPORATED, Dallas, TX (US)

(72) Inventors: Taisuke Kazama, Plano, TX (US); Mustapha El-Markhi, Richardson, TX (US); Avadhut Junnarkar, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/059,832

(22) Filed: Nov. 29, 2022

(51) Int. Cl.
- *H02M 1/00* (2006.01)
- *H01L 29/866* (2006.01)
- *H02M 1/32* (2007.01)
- *H02M 3/155* (2006.01)
- *H02M 3/335* (2006.01)
- *H03K 5/00* (2006.01)
- *H03K 5/08* (2006.01)
- *H03K 17/687* (2006.01)

(52) U.S. Cl.
CPC ........... *H03K 5/084* (2013.01); *H01L 29/866* (2013.01); *H02M 3/155* (2013.01); *H03K 17/687* (2013.01)

(58) Field of Classification Search
None
See application file for complete search history.

(56) References Cited

U.S. PATENT DOCUMENTS

| | | | | |
|---|---|---|---|---|
| 5,796,278 A | * | 8/1998 | Osborn | G05F 3/30 327/108 |
| 9,360,876 B2 | * | 6/2016 | Chern | H02M 1/08 |
| 2007/0279106 A1 | | 12/2007 | Bennett | |
| 2022/0271664 A1 | | 8/2022 | Jaladanki | |

OTHER PUBLICATIONS

Partial Search Report dated Mar. 22, 2024, PCT Application No. PCT/US2023/081520 filed Nov. 29, 2023, 5 pages.

* cited by examiner

*Primary Examiner* — Kenneth B Wells
(74) *Attorney, Agent, or Firm* — Michelle F. Murray; Frank D. Cimino

(57) ABSTRACT

An adaptive clamp circuit includes a clamp circuit and a clamp control circuit. The clamp circuit includes a first transistor, a second transistor, and a variable resistor. The first transistor includes a first current terminal, a second current terminal, and a control terminal. The first current terminal is coupled to a switching terminal. The second current terminal is coupled to a ground terminal. The second transistor includes a first current terminal, a second current terminal, and a control terminal. The first current terminal of the second transistor is coupled to the control terminal of the first transistor. The second current terminal of the second transistor is coupled to the switching terminal. The variable resistor is coupled between the control terminal of the second transistor and the ground terminal. The clamp control circuit is coupled between the switching terminal and the variable resistor.

22 Claims, 6 Drawing Sheets

POWER TRANSISTOR ADAPTIVE CLAMP CIRCUIT

BACKGROUND

A DC-DC converter is an electronic circuit that converts an input direct current (DC) voltage into one or more DC output voltages that are higher or lower in magnitude than the input DC voltage. A DC-DC converter that generates an output voltage lower than the input voltage is termed a buck or step-down converter. A DC-DC converter that generates an output voltage higher than the input voltage is termed a boost or step-up converter.

Some DC-DC converter topologies include a drive/power switch coupled at a switch node to an energy storage inductor/transformer. Electrical energy is transferred through the energy storage inductor/transformer to a load by alternately opening and closing the switch as a function of a switching signal. The amount of electrical energy transferred to the load is a function of the ON/OFF duty cycle of the switch and the frequency of the switching signal. DC-DC converters are widely used in electronic devices, particularly battery powered devices, such as portable cellular phones, laptop computers, and other electronic systems in which efficient use of power is desirable.

SUMMARY

In one example, an adaptive clamp circuit includes a clamp circuit and a clamp control circuit. The clamp circuit includes a first transistor, a second transistor, and a variable resistor. The first transistor includes a first current terminal, a second current terminal, and a control terminal. The first current terminal is coupled to a switching terminal. The second current terminal is coupled to a ground terminal. The second transistor includes a first current terminal, a second current terminal, and a control terminal. The first current terminal of the second transistor is coupled to the control terminal of the first transistor. The second current terminal of the second transistor is coupled to the switching terminal. The variable resistor is coupled between the control terminal of the second transistor and the ground terminal. The clamp control circuit is coupled between the switching terminal and the variable resistor.

In another example, an adaptive clamp circuit includes a clamp circuit and a clamp control circuit. The clamp circuit is configured to limit a voltage at a switching terminal. The clamp circuit includes a variable resistor. The variable resistor is configured to set a threshold voltage for activation of the clamp circuit. The clamp control circuit is coupled to the clamp circuit. The clamp control circuit includes a current sense amplifier. The current sense amplifier includes a first input and a second input. The first input is coupled to the switching terminal. The second input is coupled to a ground terminal. The current sense amplifier is configured to sense a current flowing between the switching terminal and the ground terminal. The clamp control circuit is configured to vary a resistance of the variable resistor responsive to a change in a current sensed by the current sense amplifier.

In a further example, a DC-DC converter includes a high-side transistor, a low-side transistor, a clamp circuit, and a clamp control circuit. The high-side transistor includes a first current terminal and a second current terminal. The first current terminal is coupled to a power supply input terminal. The low-side transistor includes a first current terminal coupled to the second current terminal of the high-side transistor, and a second current terminal coupled to a ground terminal. The clamp circuit is coupled to the first current terminal of the low-side transistor. The clamp circuit is configured to limit a voltage at the first current terminal of the low-side transistor. The clamp circuit includes a variable resistor configured to set a threshold voltage for activation of the clamp circuit. The clamp control circuit is coupled between the low-side transistor and the clamp circuit. The clamp control circuit is configured to vary a resistance of the variable resistor responsive to a change in current flowing through the low-side transistor.

DETAILED DESCRIPTION

Efficiency is an important consideration in DC-DC converters. To increase efficiency, gate drivers provide rapid turn-on and turn-off the DC-DC converter power transistors, and the power transistors provide low on resistance. However, rapid turn-on and turn-off increases ringing, which increases the drain-source voltage (Vps) across the power transistors. The power transistors may be damaged if the VDS exceeds the transistor's safe operating voltage. Power transistor breakdown voltage may fall in conjunction with specific on-resistance, which increases the likelihood of transistor damage due to ringing overvoltage.

DC-DC converters may include VDS clamp circuits to protect the power transistors. However, when active, the clamp circuit reduces converter efficiency. So, setting the clamp circuit threshold voltage is a tradeoff of protection and efficiency. Ringing and stress on the power transistors increase when powering greater loads. Clamp voltage may also increase with load, which may result in damage to the power transistors. With negative current flow (current flow through the low-side power transistor to ground), the likelihood of the damage to the low-side power transistor increases. Therefore, high load conditions and negative current conditions should be treated more conservatively than light load conditions and positive current conditions.

The clamp circuits described herein vary the clamp voltage based on load current to provide high efficiency under nominal load conditions, and protect the power transistors under high load conditions. Under nominal load conditions, ringing and stress of the power transistors is lower, and the clamp circuits may increase the clamp voltage to increase efficiency. Under higher load conditions, ringing and stress increase (relative to nominal load conditions), and the clamp circuits may decrease the clamp voltage to protect the power transistors. The clamp circuits may also include a resistor-capacitor (RC) snubber to dampen ringing and further protect the power transistors. The clamp circuits may vary the time constant of the RC snubber based on the DC-DC converter load current and/or input voltage.

Figure 1:
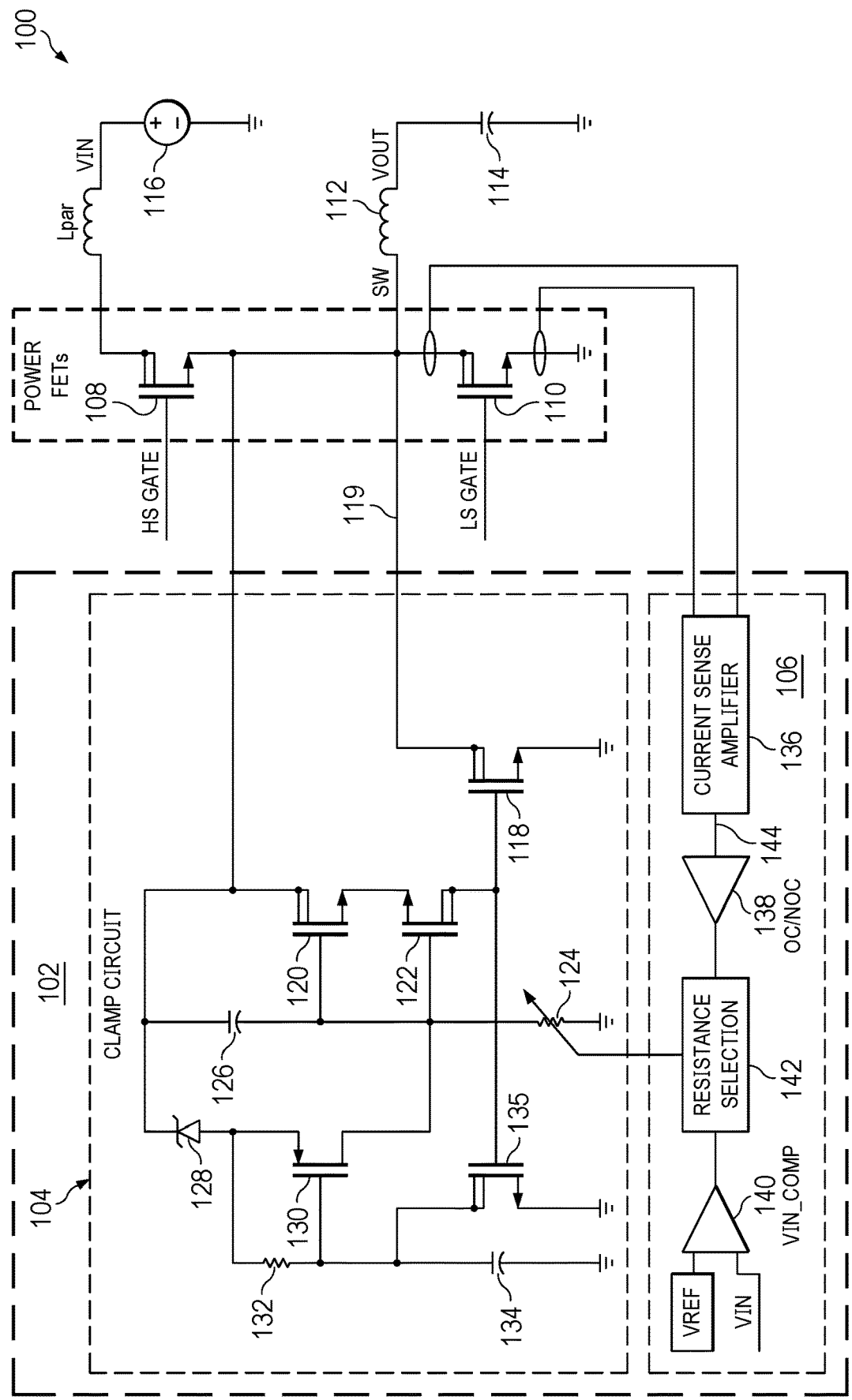
FIG. 1 is a schematic level diagram of an example adaptive clamp circuit in a DC-DC converter.

FIG. 1 is a schematic level diagram for an example adaptive clamp circuit 102 implemented in a DC-DC converter 100. To promote clarity, various components (e.g., error amplifier, pulse width modulation circuitry, etc.) of DC-DC converter 100 have been omitted from FIG. 1. More specifically, in the DC-DC converter 100, a high-side transistor 108, a low-side transistor 110, an inductor 112, and an output capacitor 114 are shown. A drain of the high-side transistor 108 is coupled to a voltage source 116 (e.g., a battery or AC-DC power supply) via a parasitic inductance (Lpar). A source of the high-side transistor 108 is coupled to the inductor 112, and the inductor 112 is coupled to the output capacitor 114. A drain of the low-side transistor 110 is coupled to the source of the high-side transistor 108, and the source of the low-side transistor 110 is coupled to a ground terminal. The gates of the high-side transistor 108 and the low-side transistor 110 are coupled to driver circuits (not shown) that rapidly charge and discharge the gate capacitance of the high-side transistor 108 and the low-side transistor 110. The high-side transistor 108 and the low-side transistor 110 may be n-channel metal oxide semiconductor field effect transistors (MOSFETs). Parasitic inductance in the DC-DC converter 100 causes ringing at the drain and/or the source of the high-side transistor 108 and the low-side transistor 110 during switching.

The adaptive clamp circuit 102 is coupled to the high-side transistor 108 and the low-side transistor 110 to suppress ringing and clamp the voltage at the source of the high-side transistor 108 and the drain of the low-side transistor 110 below a selected threshold. The adaptive clamp circuit 102 includes a clamp circuit 104 and a clamp control circuit 106. The clamp circuit 104 is coupled to the source of the high-side transistor 108 and the drain of the low-side transistor 110, and provides a switchable path for current flow to ground if the voltage at the source of the high-side transistor 108 and the drain of the low-side transistor 110 exceeds a predetermined threshold voltage. The clamp control circuit 106 sets the threshold for clamping based on the current flowing through the low-side transistor 110 and/or the power supply voltage (VIN) provided at the drain of the high-side transistor 108. The clamp control circuit 106 decreases the clamp threshold if higher current is flowing through the low-side transistor 110 to protect the low-side transistor 110, and increases the clamp threshold if lower current is flowing through the low-side transistor 110 to improve efficiency.

The clamp circuit 104 includes a transistor 118, a transistor 120, a transistor 122, a variable resistor 124, a capacitor 126, a Zener diode 128, a transistor 130, a resistor 132, a capacitor 134, and a transistor 135. The transistor 118, the transistor 120, the transistor 122, and the transistor 135 may be n-channel field effect transistors (NFETs). The transistor 130 may be a p-channel field effect transistor (PFET). The transistor 118 provides a path for switching current from the source of the high-side transistor 108 and the drain of the low-side transistor 110 to ground to reduce ringing voltage at the drain of the low-side transistor 110. A first current terminal (e.g., drain) of the transistor 118 is coupled to a switching terminal 119, and to the drain of the low-side transistor 110. A second current terminal (e.g., source) of the transistor 118 is coupled to a ground terminal. A control terminal (e.g., gate) of the transistor 118 is coupled to the transistor 122.

The transistor 118 is turned on by current flowing through transistor 120 and the transistor 122. A first current terminal (e.g., drain) of the transistor 120 is coupled to the drain of the low-side transistor 110. A second current terminal (e.g., source) of the transistor 120 is coupled to a first current terminal (e.g., source) of the transistor 122. A second current terminal (e.g., drain) of the transistor 122 is coupled to the control terminal of the transistor 118. The transistor 122 allows current to flow from the transistor 120 (from the switching terminal 119) to the gate of the transistor 118, and blocks current flow from the gate of the transistor 118 to the transistor 120. In some implementations of the adaptive clamp circuit 102, the transistor 122 may be replaced by a diode, where an anode of the diode is coupled to the source of the transistor 120 and the cathode of the diode is coupled to the gate of the transistor 118.

The capacitor 126 operates as a snubber capacitor, and is coupled between the first current terminal of the transistor 120 and the control terminal (e.g., gate) of the transistor 120. The control terminal of the transistor 120 is coupled to the control terminal (e.g., gate) of the transistor 122. The variable resistor 124 is coupled between the control terminal of the transistor 122 and the ground terminal. The variable resistor 124 is coupled to the capacitor 126 to form an RC snubber circuit that provides a path for discharge of transients at the drain of the low-side transistor 110. The resistance of the variable resistor 124 is selected (varied) based on the current sensed flowing through the low-side transistor 110 and/or the power supply voltage at the drain of the high-side transistor 108 to set the time constant of the snubber circuit and to set the clamp threshold. Some implementations of the clamp circuit 104 may lack the capacitor 126.

The Zener diode 128 includes a cathode coupled to the first current terminal of the transistor 118, and an anode coupled to a first current terminal (e.g., source) of the transistor 130. The resistor 132 is coupled between the first current terminal of the transistor 130 and a control terminal (e.g., gate) of the transistor 130. A second current terminal (e.g., drain) of the transistor 130 is coupled to the control terminal of the transistor 122. The capacitor 134 is coupled between the control terminal of the transistor 130 and ground. When the voltage at the drain of the low-side transistor 110 exceeds the reverse breakdown voltage of the Zener diode 128, current flows through the transistor 130 and the variable resistor 124. The voltage developed across the variable resistor 124 is a function of the resistance of the variable resistor 124. When the voltage across the variable resistor 124 exceeds the thresholds of the transistor 120 and transistor 122, the transistor 118 is turned on to clamp the voltage at the drain of the low-side transistor 110.

The transistor 135 holds the transistor 118 on for as long as the voltage at the switching terminal 119 exceeds the clamp threshold. A first current terminal (e.g., drain) of the transistor 135 is coupled to the control terminal of the transistor 130. A second current terminal (e.g., source) of the transistor 135 is coupled to the ground terminal. A control terminal (e.g., gate) of the transistor 135 is coupled to the control terminal of the transistor 118. When the transistor 118 is turned on by current flowing through the transistor 120 and the transistor 122, the transistor 135 is also turned on. The transistor 135 pulls down the control terminal of the transistor 130 which, holds on the transistor 120 and the transistor 122 until the voltage at the switching terminal 119 drops below the reverse breakdown voltage of the Zener diode 128.

Various implementations of the variable resistor 124 may be suitable for use in the clamp circuit 104. In one example, the variable resistor 124 may be implemented as multiple FETs connected in series (e.g., a source of a first FET coupled to a drain of a second FET) with common gate control coupled to the clamp control circuit 106. In another example, the variable resistor 124 may be implemented as resistors coupled in series with bypass switches in parallel with one or more of the resistors, or output switches coupled to each resistor, where the switches are coupled to and controlled by the clamp control circuit 106. In a further example, the variable resistor 124 may be implemented as resistors coupled in parallel to a selector switch that is coupled to and controlled by the clamp control circuit 106.

The clamp control circuit 106 controls the resistance of the variable resistor 124 based on the current flowing through the low-side transistor 110 and/or the power supply input voltage VIN. The clamp control circuit 106 includes a current sense amplifier 136, a current comparator 138, a voltage comparator 140, and a resistance selection circuit 142. Some implementations of the clamp control circuit 106 may include only one of the current comparator 138 or the voltage comparator 140. The current sense amplifier 136 includes a first input coupled to the drain of the low-side transistor 110 and a second input coupled to the source of the low-side transistor 110. The current sense amplifier 136 generates a sensed current signal 144 representative of the current sensed flowing between the first input and the second input (current flowing through the low-side transistor 110). The current comparator 138 is coupled to the current sense amplifier 136, and compares the sensed current signal 144 to one or more thresholds. The thresholds represent current values at which the resistance of the variable resistor 124 is changed. For example, the current comparator 138 may compare the sensed current signal 144 to an overcurrent threshold and a negative overcurrent threshold, and provide a signal to the resistance selection circuit 142 indicating whether the whether the sensed current signal 144 exceeds a threshold, and in some implementations including multiple thresholds, which particular thresholds are currently exceeded.

The voltage comparator 140 includes a first input coupled to a power supply voltage input terminal of the adaptive clamp circuit 102, and a second input coupled to a reference voltage circuit. The voltage comparator 140 compares VIN to one or more reference voltages. Each reference voltage represents a VIN value (a predetermined voltage threshold) at which the resistance of the variable resistor 124 is changed. For example, the voltage comparator 140 may compare VIN to a reference voltage (or multiple reference voltages), and provide a signal to the resistance selection circuit 142 indicating whether VIN exceeds a reference voltage, and in some implementations, which particular reference voltages are currently exceeded.

The resistance selection circuit 142 includes inputs coupled to the current comparator 138 and the voltage comparator 140, and an output coupled to a control input of the variable resistor 124. The resistance selection circuit 142 selects or sets the resistance of the variable resistor 124 based on the signals received from the current comparator 138 and/or the voltage comparator 140. If the signal received from the current comparator 138 indicates that the current flowing through the low-side transistor 110 has increased to exceed a predetermined current threshold, then the resistance selection circuit 142 generates an output signal that sets the resistance of the variable resistor 124 to a greater value, which produces a lower clamp voltage and a longer snubber time constant. If the signal received from the current comparator 138 indicates that the current flowing through the low-side transistor 110 has decreased to a value below the predetermined current threshold, then the resistance selection circuit 142 generates an output signal that sets the resistance of the variable resistor 124 to a smaller value, which produces a higher clamp voltage and a shorter snubber time constant. The resistance selection circuit 142 generates an output signal suitable for controlling the variable resistor 124 implemented in the clamp circuit 104. For example, the resistance selection circuit 142 may generate switch control signals to control the resistance of the variable resistor 124, or may generate voltage steps to control the resistance of the variable resistor 124 in accordance with the implementation of the variable resistor 124.

Figure 2:
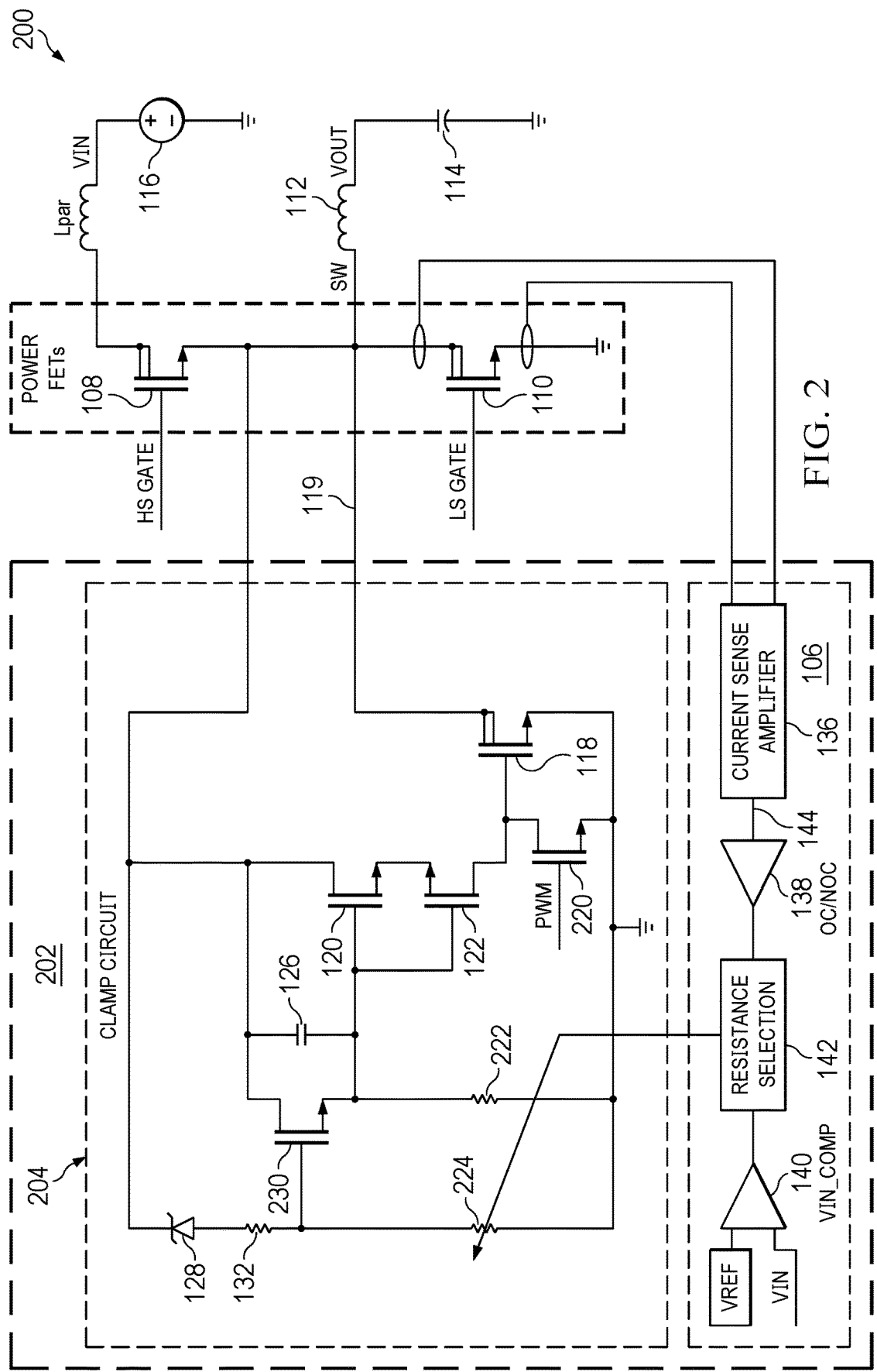
FIG. 2 is a schematic level diagram of another example adaptive clamp circuit in a DC-DC converter.

FIG. 2 is a schematic level diagram for an example adaptive clamp circuit 202 implemented in a DC-DC converter 200. The DC-DC converter 200 is similar to the DC-DC converter 100, and the adaptive clamp circuit 202 is similar to the adaptive clamp circuit 102. The adaptive clamp circuit 202 allows the clamp threshold and the time constant of the RC snubber to be set independently, while in the adaptive clamp circuit 102, the clamp threshold and the time constant of the RC snubber are both set by the variable resistor 124. The adaptive clamp circuit 202 includes a clamp circuit 204 and the clamp control circuit 106. The clamp circuit 204 is similar to the clamp circuit 104, but in the clamp circuit 204 the RC snubber has a fixed time constant. The clamp circuit 204 includes the transistor 118, the transistor 120, the transistor 122, the capacitor 126, the Zener diode 128, and the resistor 132 as described with respect to the clamp circuit 104. The clamp circuit 204 also includes a transistor 220, a transistor 230, resistor 222 and a variable resistor 224. The transistor 230 may an NFET. The transistor 230 includes a first current terminal (e.g., drain) coupled to the switching terminal 119, and a second current terminal (e.g., source) coupled to the control terminal of the transistor 120. A control terminal (e.g., gate) of the 230 is coupled to anode of the Zener diode 128 via the resistor 132. The resistor 222 has a fixed resistance, and is coupled between the second current terminal of the transistor 230 (and the bottom plate of the capacitor 126) and the ground terminal to set the time constant of the RC snubber formed by the capacitor 126 and the resistor 222. In some implementations of the 204, the resistor 222 is variable to allow the time constant of the RC snubber to be set as needed.

The transistor 220 enables control of the transistor 118 by circuitry external to the adaptive clamp circuit 202. For example, the transistor 220 may be activated to turn-off the transistor 118 during a portion of a PWM cycle by a signal received from a PWM circuit (not shown). The transistor 220 includes a first current terminal (e.g., drain) coupled to the control terminal of the transistor 118, and a second current terminal (e.g., source) coupled to the ground terminal. A control terminal (e.g., gate) of the transistor 220 is coupled to the PWM circuit, which is external to the adaptive clamp circuit 202.

The variable resistor 224 is similar to the variable resistor 124, and includes a first terminal coupled to the control terminal of the transistor 230, a second terminal coupled to the ground terminal, and a control terminal coupled to the output of the resistance selection circuit 142. The clamp control circuit 106 controls the resistance of the variable resistor 224 to vary the clamp threshold of the adaptive clamp circuit 202 based on the current sensed by the current sense amplifier 136 and/or the power supply voltage (VIN).

While the adaptive clamp circuits 102 and 202 are illustrated in in the context of a buck converter, the adaptive clamp circuits 102 and 202 may be used in other types of DC-DC converters (e.g., boost, buck-boost, etc.), and in other circuits that benefit from reduction of power transistor switching transients.

Figure 3:
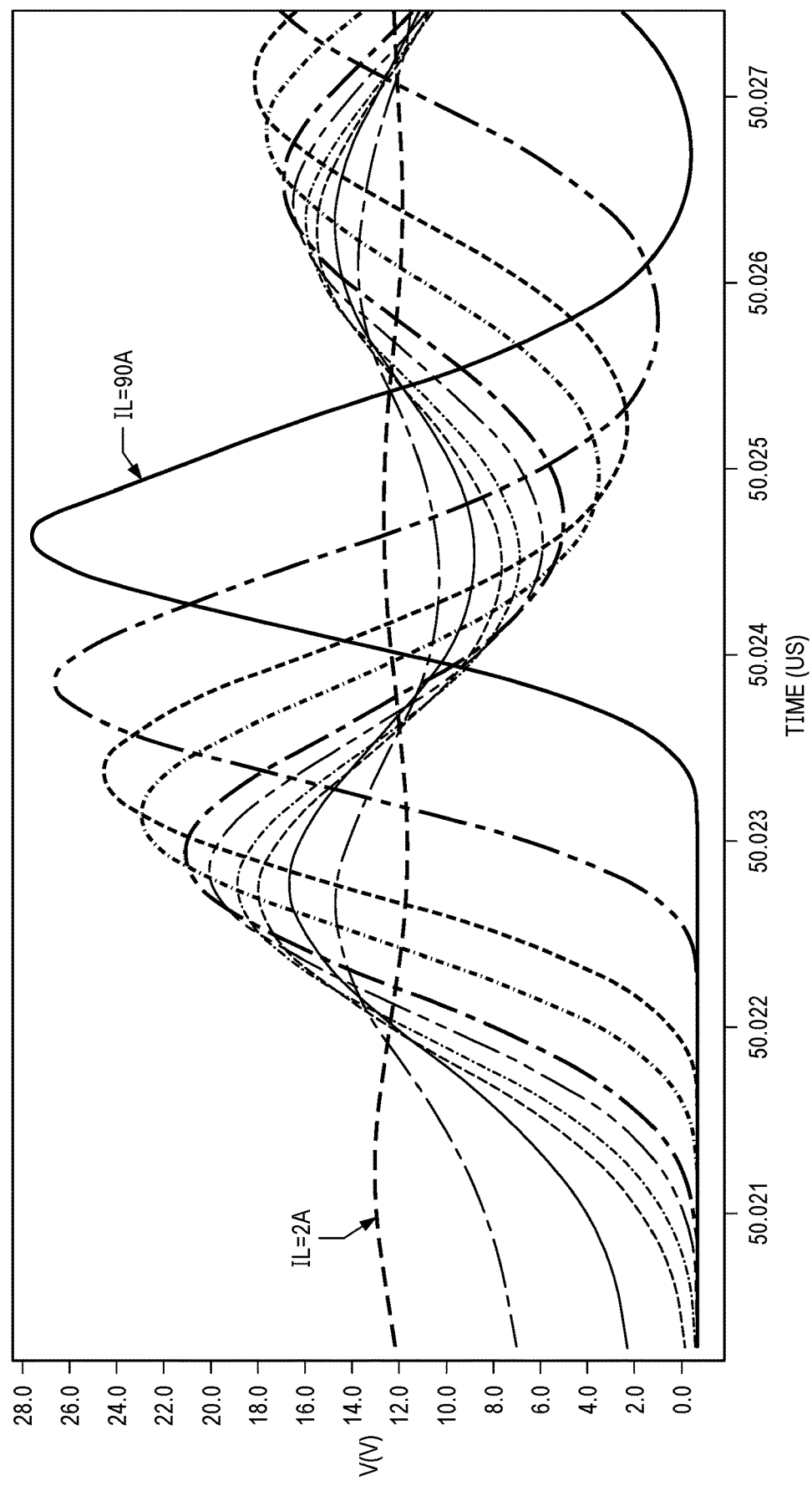
FIG. 3 is a graph of example drain-source voltage ringing over a range of load currents in a DC-DC converter that lacks the adaptive clamp circuit of FIG. 1.

FIG. 3 is a graph of example drain-source voltage ringing over a range of load currents in a DC-DC converter that lacks the adaptive clamp circuit 102. Drain-source voltage ringing at the low-side power transistor with load currents ranging from 2 amperes to 90 amperes is shown in FIG. 3. The maximum ringing voltage is about 28V without the adaptive clamp circuit.

Figure 4:
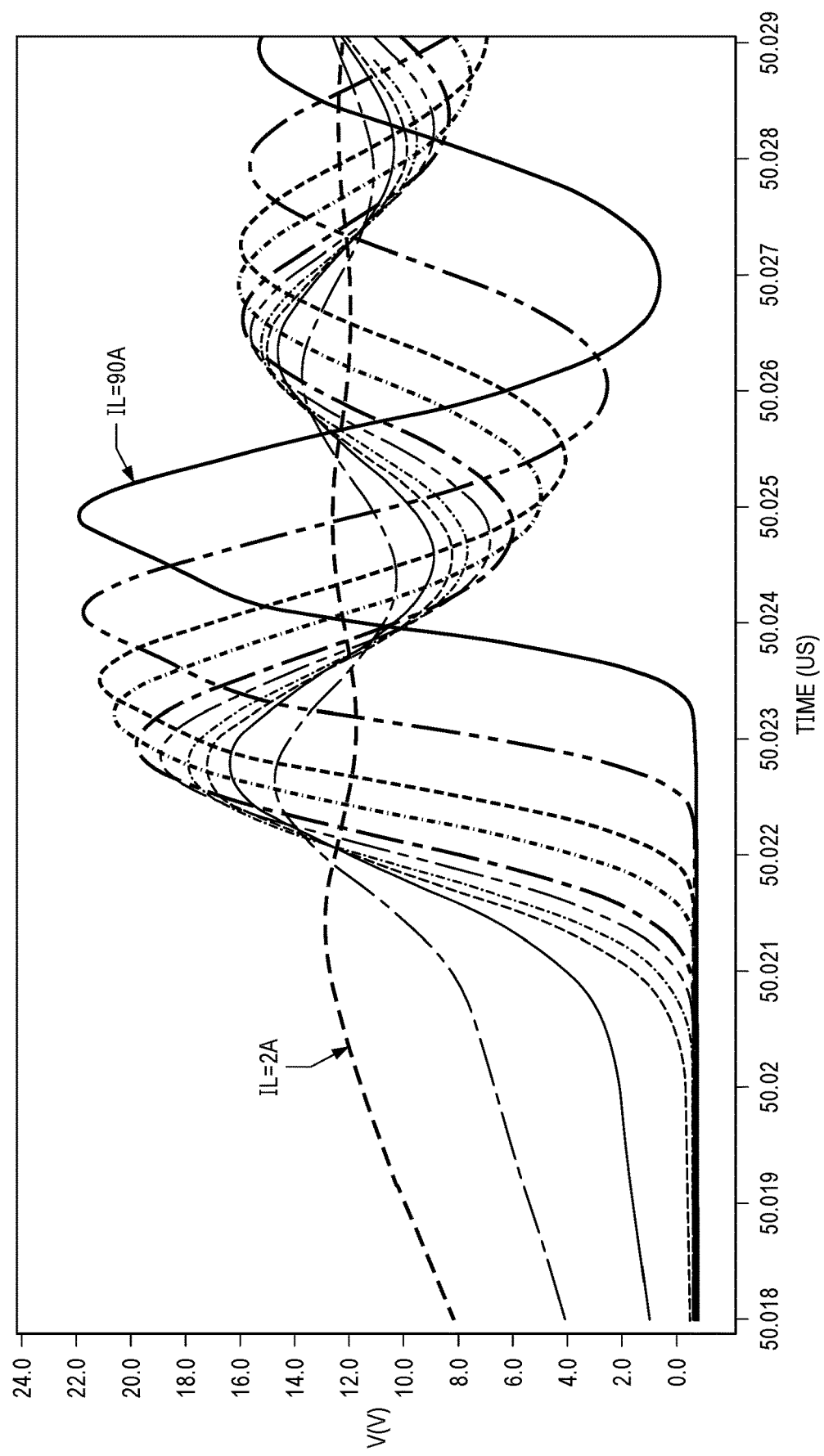
FIG. 4 is a graph of example drain-source voltage ringing over a range of load currents in the DC-DC converter of FIG. 1

FIG. 4 is a graph of example drain-source voltage ringing over a range of load currents in a DC-DC converter that includes the adaptive clamp circuit 102 (e.g., the DC-DC converter 100). Drain-source voltage ringing at the low-side power transistor with load currents ranging from 2 amperes to 90 amperes is shown in FIG. 3. The maximum ringing voltage with the adaptive clamp circuit 102 is about 22 volts. Accordingly, the adaptive clamp circuit 102 significantly reduces ringing at the low-side power transistor, which reduces EMI and the likelihood of damage to the low-side power transistor.

Figure 5:
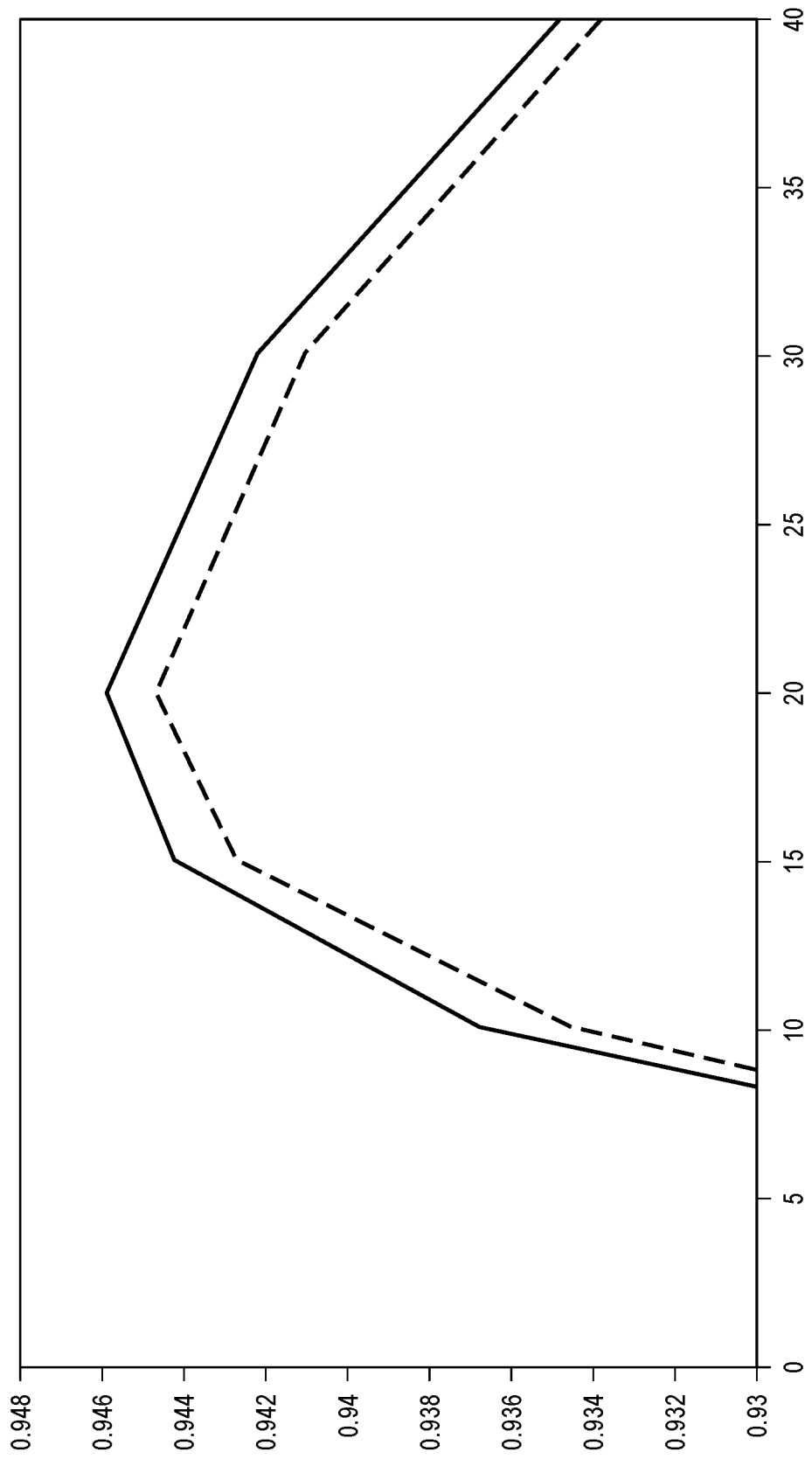
FIG. 5 is a graph showing efficiency of an example DC-DC converter with and without the adaptive clamp circuit of FIG. 1.

FIG. 5 is a graph showing efficiency of an example DC-DC converter with and without the adaptive clamp circuit 102. FIG. 5 shows that when operating at peak efficiency, the adaptive clamp circuit 102 is only about 0.2% less efficient than the DC-DC converter that lacks the adaptive clamp circuit 102.

Figure 6:
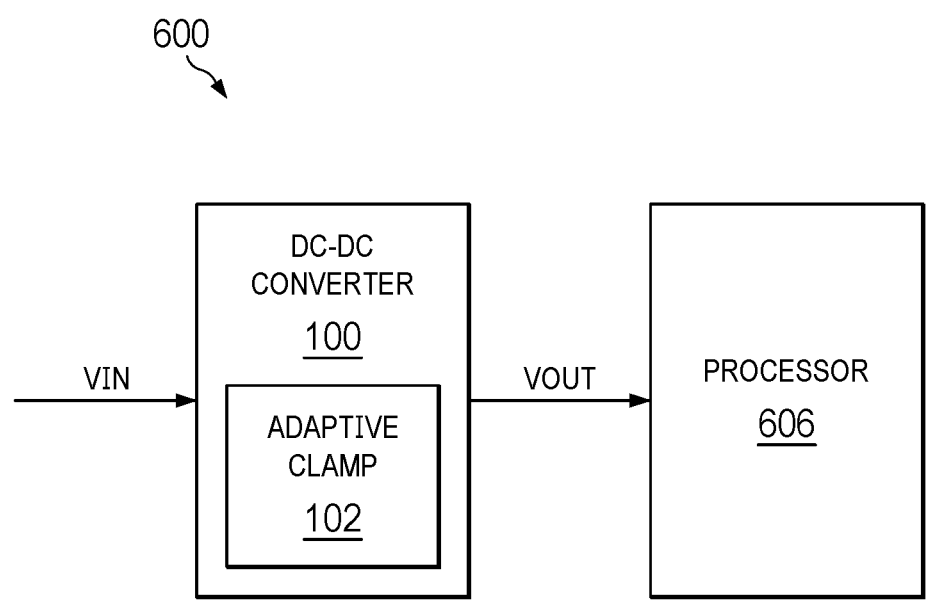
FIG. 6 is a block diagram of an example processor circuit that includes the DC-DC converter of FIG. 1.

FIG. 6 is a block diagram of an example processor circuit 600 that includes the DC-DC converter 100. The DC-DC converter 100 converts the power supply input voltage (VIN) to a voltage (VOUT) suitable for powering the processor 606. The processor 606 may be general-purpose microprocessor, a graphics processor, a network processor, a digital signal processor, an application specific processor, a field programmable gate array, or any other instruction execution circuit or electronic circuit. The adaptive clamp circuit 102 reduces EMI emanating from the DC-DC converter 100, and protects the DC-DC converter 100 from damage caused by switching transient overvoltage.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors, or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals. In the context of a FET, the control input is the gate, and the current terminals are the drain and source. In the context of a BJT, the control input is the base, and the current terminals are the collector and emitter.

References herein to a FET being "on" means that the conduction channel of the FET is present and drain current may flow through the FET. References herein to a FET being "off" means that the conduction channel is not present and drain current does not flow through the FET. An "off" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described embodiments, and other embodiments are possible, within the scope of the claims.

What is claimed is:

1. An adaptive clamp circuit, comprising:
   a clamp circuit including:
      a first transistor having:
         a first current terminal coupled to a switching terminal;
         a second current terminal coupled to a ground terminal; and
         a control terminal;
      a second transistor having:
         a first current terminal coupled to the control terminal of the first transistor;
         a second current terminal coupled to the switching terminal; and
         a control terminal; and
      a variable resistor coupled between the control terminal of the second transistor and the ground terminal; and
   a clamp control circuit coupled between the switching terminal and the variable resistor.

2. The adaptive clamp circuit of claim 1, wherein the clamp circuit includes a capacitor coupled between the switching terminal and the control terminal of the second transistor.

3. The adaptive clamp circuit of claim 1, wherein the clamp circuit further includes:
   a third transistor including:
      a first current terminal coupled to the switching terminal;
      a second current terminal coupled to the second current terminal of the second transistor; and
      a control terminal coupled to the control terminal of the second transistor.

4. The adaptive clamp circuit of claim 3, wherein the clamp circuit further includes:
   a Zener diode including:
      a cathode coupled to the switching terminal; and
      an anode; and
   a fourth transistor including:
      a first current terminal coupled to the anode; and
      a second current terminal coupled to the control terminal of the second transistor.

5. The adaptive clamp circuit of claim 4, wherein:
   the fourth transistor further includes a control terminal; and
   the clamp circuit further includes:
      a resistor coupled between the control terminal of the fourth transistor and the anode; and
      a capacitor coupled between the control terminal of the fourth transistor and the ground terminal.

6. The adaptive clamp circuit of claim 4, wherein:
   the fourth transistor further includes a control terminal; and
   the clamp circuit further includes:
      a fifth transistor including:
         a first current terminal coupled to the control terminal of the fourth transistor;
         a second current terminal coupled to the ground terminal; and
         a control terminal coupled to the control terminal of the first transistor.

7. The adaptive clamp circuit of claim 1, wherein:
   the variable resistor includes a control input; and
   the clamp control circuit includes:
      a current sense amplifier including:
         an input coupled to the switching terminal; and
         an output; and
      a current comparator including:
         an input coupled to the output of the current sense amplifier; and
         an output coupled to the control input of the variable resistor.

8. The adaptive clamp circuit of claim 1, wherein:
   the variable resistor includes a control input; and
   the clamp control circuit includes:
      a voltage comparator including:
         a first input coupled to a reference voltage circuit;
         a second input coupled to a power supply input terminal; and
         an output coupled the control input of the variable resistor.

9. An adaptive clamp circuit, comprising:
   a clamp circuit configured to limit a voltage at a switching terminal, and including:
      a variable resistor configured to set a threshold voltage for activation of the clamp circuit; and
   a clamp control circuit coupled to the clamp circuit, and including:
      a current sense amplifier including:
         a first input coupled to the switching terminal; and
         a second input coupled to a ground terminal;
         the current sense amplifier configured to sense a current flowing between the switching terminal and the ground terminal; and
      the clamp control circuit configured to vary a resistance of the variable resistor responsive to a change in the current sensed by the current sense amplifier.

10. The adaptive clamp circuit of claim 9, wherein:
    the clamp control circuit further includes a current comparator coupled to the current sense amplifier, the current comparator configured to compare the current sensed by the current sense amplifier to a predetermined current threshold; and
    the clamp control circuit is configured to change the resistance of the variable resistor responsive to the current sensed by the current sense amplifier exceeding the predetermined current threshold.

11. The adaptive clamp circuit of claim 10, wherein the clamp control circuit is configured to:
    increase the resistance of the variable resistor based on the current sensed by the current sense amplifier being greater than the predetermined current threshold; and
    decrease the resistance of the variable resistor based on the current sensed by the current sense amplifier being less than the predetermined current threshold.

12. The adaptive clamp circuit of claim 9, wherein:
the clamp control circuit further includes a voltage comparator coupled to a power supply input terminal, the voltage comparator configured to compare a voltage at the power supply input terminal to a predetermined voltage threshold; and
the clamp control circuit is configured to change the resistance of the variable resistor responsive to the voltage at the power supply input terminal exceeding a predetermined voltage threshold.

13. The adaptive clamp circuit of claim 12, wherein the clamp control circuit is configured to:
increase the resistance of the variable resistor based on the voltage at the power supply input terminal being greater than the predetermined voltage threshold; and
decrease the resistance of the variable resistor based on the voltage at the power supply input terminal being less than the predetermined voltage threshold.

14. The adaptive clamp circuit of claim 9, wherein:
the clamp circuit includes:
a snubber circuit including:
the variable resistor; and
a capacitor coupled between the switching terminal and the variable resistor; and
the clamp control circuit is configured to change a time constant of the snubber circuit responsive to the change in the current sensed by the current sense amplifier.

15. The adaptive clamp circuit of claim 9, wherein the clamp circuit further includes:
a snubber circuit including:
a resistor coupled to the ground terminal and having a fixed resistance; and
a capacitor coupled between the switching terminal and the resistor.

16. A DC-DC converter, comprising:
a high-side transistor including:
a first current terminal coupled to a power supply input terminal; and
a second current terminal;
a low-side transistor including:
a first current terminal coupled to the second current terminal of the high-side transistor; and
a second current terminal coupled to a ground terminal;
a clamp circuit coupled to the first current terminal of the low-side transistor, the clamp circuit configured to limit a voltage at the first current terminal of the low-side transistor, the clamp circuit including a variable resistor configured to set a threshold voltage for activation of the clamp circuit; and
a clamp control circuit coupled between the low-side transistor and the clamp circuit, the clamp control circuit configured to vary a resistance of the variable resistor responsive to a change in a current flowing through the low-side transistor.

17. The DC-DC converter of claim 16, wherein:
the clamp control circuit includes:
a current sense amplifier configured to sense the current flowing through the low-side transistor, the current sense amplifier including:
a first input coupled to the first current terminal of the low-side transistor; and
a second input coupled to the second current terminal of the low-side transistor.

18. The DC-DC converter of claim 17, wherein:
the current sense amplifier further includes an output; and
the clamp control circuit further includes a current comparator coupled to the output of the current sense amplifier, the clamp control circuit configured to compare the current sensed by the current sense amplifier to a predetermined current threshold; and
the clamp control circuit is configured to change the resistance of the variable resistor responsive to the current sensed by the current sense amplifier exceeding the predetermined current threshold.

19. The DC-DC converter of claim 18, wherein the clamp control circuit is configured to:
increase the resistance of the variable resistor based on the current flowing through the low-side transistor being greater than the predetermined current threshold; and
decrease the resistance of the variable resistor based on the current flowing through the low-side transistor being less than the predetermined current threshold.

20. The DC-DC converter of claim 16, wherein:
the clamp control circuit includes a voltage comparator coupled to the power supply input terminal, the voltage comparator configured to compare a power supply input voltage at the power supply input terminal to a predetermined voltage threshold; and
the clamp control circuit is configured to change the resistance of the variable resistor responsive to the power supply input voltage exceeding a predetermined voltage threshold.

21. The DC-DC converter of claim 20, wherein the clamp control circuit is configured to:
increase the resistance of the variable resistor based on the power supply input voltage being greater than the predetermined voltage threshold; and
decrease the resistance of the variable resistor based on the power supply input voltage being less than the predetermined voltage threshold.

22. The DC-DC converter of claim 16, wherein:
the clamp circuit further includes:
a snubber circuit including:
the variable resistor; and
a capacitor coupled between the first current terminal of the low-side transistor and the variable resistor; and
the clamp control circuit is configured to change a time constant of the snubber circuit responsive to the change in current flowing through the low-side transistor.

\* \* \* \* \*